United States Patent [19]

Rothermel

[11] Patent Number: 5,412,311
[45] Date of Patent: May 2, 1995

[54] SYSTEM FOR UNAMBIGUOUSLY DETERMINING THE PHASE OF AN INPUT SIGNAL OF RELATIVE TO A CLOCK REFERENCE SIGNAL

[75] Inventor: Albrecht Rothermel, VS-Villingen, Germany

[73] Assignee: Deutsche Thomson-Brandt GmbH, Villengen-Schwenningen, Germany

[21] Appl. No.: 43,395

[22] Filed: Apr. 6, 1993

[30] Foreign Application Priority Data

Apr. 8, 1992 [DE] Germany .............. 42 11 701.1

[51] Int. Cl.⁶ ........................... G01R 25/00
[52] U.S. Cl. .................... 324/76.82; 327/7; 327/12
[58] Field of Search ........... 328/133, 134; 307/514, 307/525, 527, 528; 324/76.82

[56] References Cited

U.S. PATENT DOCUMENTS

| | | | |
|---|---|---|---|
| 4,721,905 | 1/1988 | Mehrgardt | 324/76.82 |
| 4,884,020 | 11/1989 | Blakeslee | 324/76.82 |
| 4,963,817 | 10/1990 | Kohiyama | 324/76.82 |
| 5,128,624 | 7/1992 | Hoshino | 328/133 |

FOREIGN PATENT DOCUMENTS 0225396 6/1987 European Pat. Off. .
439178 7/1991 European Pat. Off. .
3132069 3/1983 Germany .
3913872 11/1990 Germany .

*Primary Examiner*—Kenneth A. Wieder
*Assistant Examiner*—Jose M. Solis
*Attorney, Agent, or Firm*—Joseph S. Tripoli; Eric P. Herrmann; Ronald H. Kurdyla

[57] ABSTRACT

A clocked digital signal processing system includes apparatus for unambiguously indicating the phase of an input signal relative to a reference clock signal. In particular, the disclosed apparatus reduces timing uncertainty between the reference clock, and the output signal of a phase detector representing the phase relationship between the input signal and the reference clock. A phase detector including a logic network provides plural comparison signals representing a phase relationship between the input and reference signals. The comparison signals are conveyed via first and second latch circuits, in respective groups, to a clocked downstream stage. The first and second latch circuits are clocked by different phases of the reference clock and provide outputs synchronous with the reference clock. The downstream stage responds to the reference clock for conveying output signals front the first and second latch circuits to an output at which the unambiguous indication appears.

4 Claims, 1 Drawing Sheet

SYSTEM FOR UNAMBIGUOUSLY DETERMINING THE PHASE OF AN INPUT SIGNAL OF RELATIVE TO A CLOCK REFERENCE SIGNAL

FIELD OF THE INVENTION

The present invention relates to a clocked digital signal processing system for unambiguously determining the phase of an input signal relative to a clock reference signal. In particular, the present invention relates to a system for reducing timing uncertainty between a reference clock, and the output signal of a phase detector representing the phase relationship between an input signal and the reference clock.

BACKGROUND OF THE INVENTION

With clocked circuits such as digital signal processing circuits for example, input signals are usually scanned or sampled at discrete points in time. If the clock is, for example, a 1 MHz signal, the clock cycles encompass one microsecond intervals. Input signals are usually also scanned and evaluated at intervals of one microsecond, i.e., in accordance with times determined by the clock. Consequently, the temporal resolution of the input signals cannot be finer than one microsecond. A digital circuit clocked at 1 MHz, for example, cannot determine if a change in an input signal has occurred, for example, 0.1 or 0.5 microseconds prior to a clock cycle. Phase measuring circuits for this purpose are described, for example, in a German patent application P 41 23 388.3. These circuits are capable of determining the phase relation between an input signal, also called a test signal, and a reference signal which may be (or derived from) a system clock. In doing this it may result, for example, in downstream stages being controlled, i.e., clocked, by the input signal rather than by the system clock.

If a significant change, for example a negative-going edge transition, occurs in the input signal, the relative temporal position which this change has in the clock raster is measured, stored and provided at an output. By using such a circuit it is possible to measure the relative temporal position of a significant change of the input signal in the clock raster of the digital circuit.

However, the output signal of this phase measuring circuit is delayed by a certain time in relation to the change in the input signal. Thus, the time at which the output signal of the phase measuring circuit occurs is determined by the time of the input signal change and by further delay times. That is, the output signal may appear unpredictably. This may produce conflicts with following stages, which sample their input signals at times determined by the clock. Thus, the output signal of the phase measuring circuit may appear exactly at the time when it is being sampled. This results in an uncertainty regarding a decision as to whether or not the output signal of the phase measuring circuit appeared before or after the clock. This decision is determined by chance or by noise. If the decision is made incorrectly, a phase measuring error of an entire clock cycle, i.e., for example, of one microsecond at a clock frequency of 1 MHz, is produced.

SUMMARY OF THE INVENTION

It is an object of the present invention to prevent this decision uncertainty, and to sample output signals of the phase measuring circuit which may occur at any time together with the clock pulse of downstream (following) stages without uncertainty. That is, it is an object of the invention to avoid phase measuring errors which may occur if a signal to be sampled and the edge of a sampling clock used to effect sampling of this signal occur at the same time.

According to the present invention, comparison signals produced as a result of a phase comparison between a test signal and a reference signal are divided into two groups. A first group is compared to a first phase of a reference signal used to clock downstream stages, and a second group is compared to a second phase of the reference signal. The reference signal may, for example, be derived from a clock signal for the phase measuring circuit and/or for the downstream stages, or the reference signal may be the clock signal itself. The phase of the reference signal can be defined so that, in a digital progression (high, low; or, respectively, "1", "0"), a differentiation is made between these two states.

It is also possible, for example with an analog reference signal having a sinusoidal, saw-toothed or similar form, to perform a differentiation based upon predetermined amplitude values.

Each of the comparison signals may be provided via a separate comparison line, and these comparison lines may be subdivided into two groups. A first group of comparison lines is provided to a first comparison component, for example, a first register. The second group of comparison lines is provided to a second comparison component, for example, a second register. The first register is triggered by the first phase position of the reference signal, and the second register is triggered by a different second phase position of the reference signal. Corresponding output signals can be coupled to further stages such as, for example, a second register or an evaluation circuit.

DESCRIPTION OF THE PREFERRED EMBODIMENTS

The blocks shown separately in the Figure serve to explain the invention. Individual ones or several of these blocks may be combined. These can be realized in integrated or hybrid circuit form, as a programmed microcomputer, or in the form of a program suitable for its control.

Figure 1:
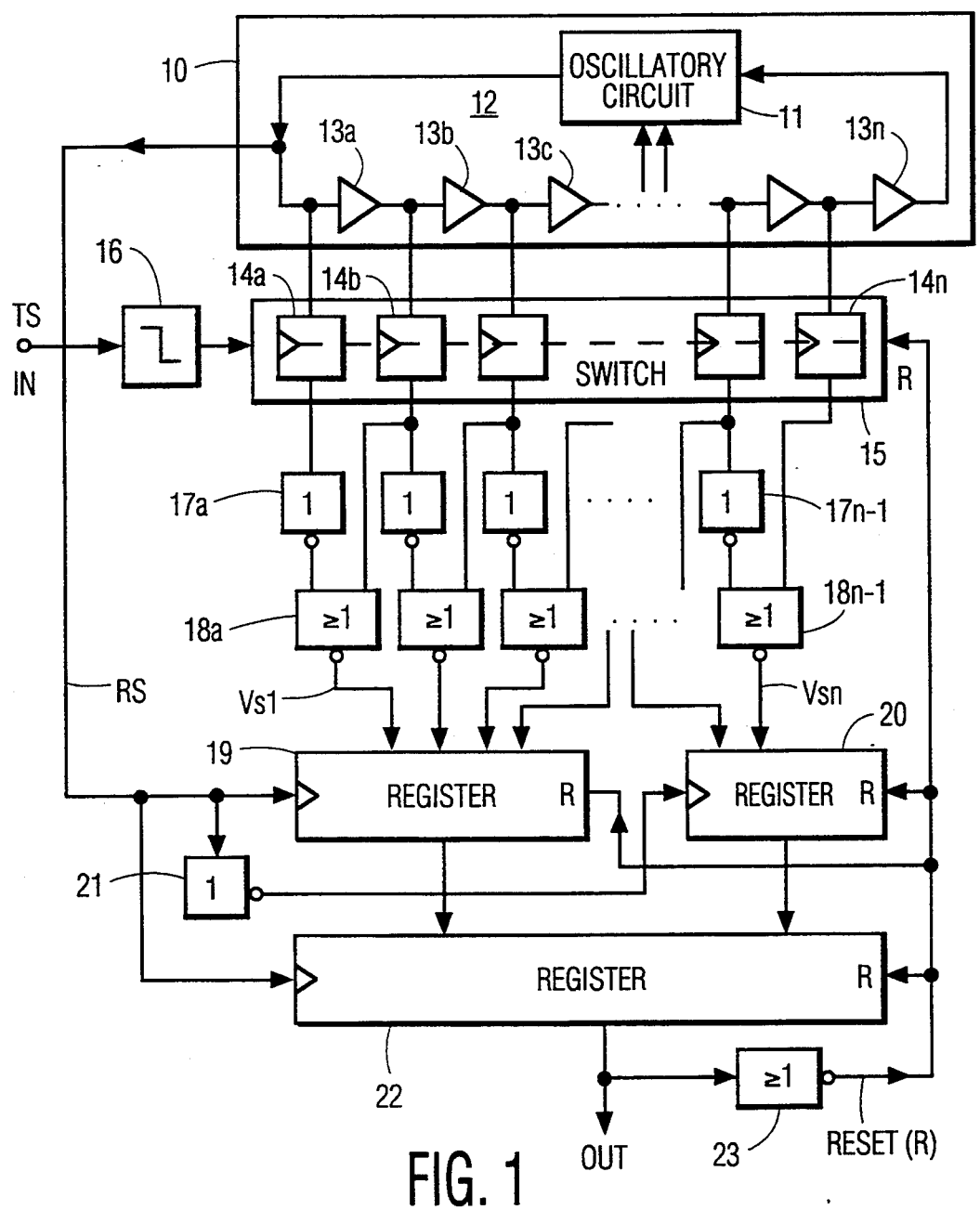
FIG. 1 is a block circuit diagram of a preferred embodiment of the invention.

FIG. 1 shows an oscillator 10 comprising an oscillatory circuit 11 and a time delay circuit 12 formed by series delay elements 13a, 13b, . . . 13n. Oscillator 10 may comprise a variety of conventional oscillator circuits. A suitable oscillator has been described in detail in previously mentioned application P 41 23 388.3.

The input signals to the delay elements are each also coupled to a data input of respective switching elements 14a, . . . 14n which belong to a switching stage 15. Switching elements 14 are edge-triggered sampling latches in this example, and are clocked by the output signal of a threshold stage 16, which is produced in response to a significant change, e.g., an edge transition, of an input test signal Ts. The outputs of latches 14 are coupled with inverters 17 and directly with logic NOR gates 18. The construction and operation of the circuit blocks named so far have also been described in the previously mentioned prior application. Registers 19, 20 and 22 in accordance with the present invention also comprise a network of latches as will be discussed.

The phase relationship between the input signal being "tested" and the clock reference signal is determined by a comparison of the input test signal with a multitude of phases of the clock reference signal. The inputs/output of delay elements 13a . . . 13n are applied to respective data inputs of sampling latches 14a . . . 14n. Sampling latches can be clocked with multiple clocks and latch the input signal. Alternatively, as shown in FIG. 1, the latches can be clocked by the input signal and latch the multiple clocks. In each case the outputs of the latches change asynchronously with the system clock.

Each latch 14 comprises a D flip-flop (i.e., a Data latch) having a clock input, a D signal input and a Q signal output as known. These latches are clocked at the same time by the input test signal from the output of unit 16. The outputs of latches 14 all change state at the same time, i.e., when the latches are triggered (clocked) by the input test signal in parallel, as a consequence of which only one of NOR gates 18 receives a "0,0" logic level input signal configuration. This process provides phase information at the outputs of latches 14. The network of inverters 17 and logic NOR gates 18 is provided to decode the outputs of latches 14 such that only one of the outputs of NOR gates 18 exhibits a logic "1" value. Latches 14 are reset by signal R after each phase measurement process, so the outputs of latches 14 normally exhibit a logic "0" level. When the latches are triggered by the input test signal from unit 16, approximately half of latches 14 change their output logic state to "1".

The output signals of NOR gates 18 form so-called comparison signals Vs1 . . . Vsn. These are each provided via a respective comparison line. A first group of comparison lines is coupled to a first register 19, and a second group of comparison lines is coupled to a second register 20. A register typically comprises a series of latches, eg., "D" type flip-flops. In this example registers 19 and 20 comprise a series of latches with inputs and outputs as shown for latches 14 of unit 15. First register 19 is clocked by a clock reference signal Rs generated by oscillator 10. This signal is also coupled to an inverter 21 whose phase inverted output signal clocks second register 20.

Output signals frown registers 19 and 20 are coupled to a third register 22, which is also clocked by clock reference signal Rs. Register 22 may also comprise a series of latches with inputs and outputs as shown for latches 14 of unit 15. The output signal of register 22 contains information for unambiguous phase determination of input test signal Ts, and can be coupled to further evaluation or signal processing stages (not shown). The output signal of register 22 is also coupled to a NOR gate 23 whose output signal serves as a reset signal for registers 19, 20, 22 and for switching device 15. To simplify the drawing, units 19, 20 and 22 are each shown as having a single output line. However, it should be recognized that each of these single output lines represents a plurality of output lines, such as shown in detail with respect to latch network 14a . . . n of unit 15.

Figure 2:
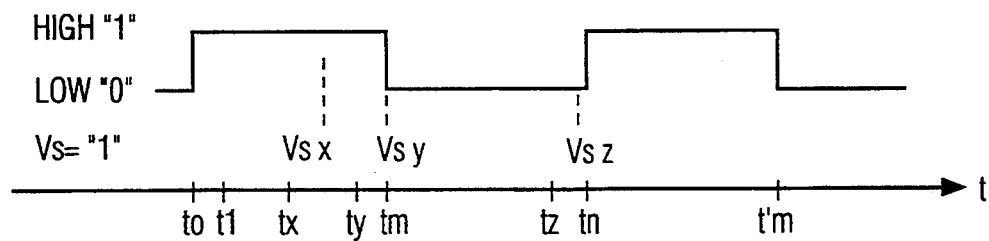
FIG. 2 is a timing diagram helpful in understanding the operation of the embodiment in FIG. 1.

The operation of the FIG. 1 embodiment is illustrated by FIG. 2, as follows.

The periodic clock reference signal, in this example in the form of a square wave signal, has an amplitude transition edge from a low to a high value at a time "to", an edge transition from a high to a low value at a time "tm", and another edge transition from a low to a high value at a time "tn".

At a time "tx," input test signal Ts exhibits a significant change through which threshold stage 16 is triggered so that latches 14 operate. Internal transit time delays cause a comparison signal Vsx to be switched from logical low ("0") to logical high ("1") at a time later than tx. Time tx in FIG. 2 is chosen such that a later time at which Vsx is switched over precedes the edge of the clock reference signal at tm.

As another example, assume that at time "ty" threshold stage 16 is triggered so that latches 14 sample. This causes comparison signal VSy to be switched to a "1" level at a time which is nearly identical with the point in time tm at which the negative edge transition of the clock reference signal (from "1" to "0") occurs.

As a third example, assume that the switchover of threshold stage 16 occurs at a time tz. The associated comparison signal VSz is switched to a "1" level only at a later time which is nearly identical with time tn at which the positive edge transition (from "0" to "1") of the clock reference signal occurs.

Registers (latches) 19, 20 operate so that a signal applied to their input is sampled at a time at which an edge of a predetermined direction, positive or negative, is present. If both registers are triggered with the same edge of the clock reference signal, it could happen that the significant change of input test signal Ts occurring at time ty or, respectively, at time tz, is taken as belonging to the first or to a later period duration of the clock reference signal. This would cause a phase measuring uncertainty with a duration of one period.

In this example, however, registers 19, 20 are triggered with different (mutually anti-phase, or inverted) phases of clock reference signal Rs. Therefore the comparison signals of the first group are processed at time tn, and the comparison signals of the second group are processed by registers 19 and 20 respectively at time tm (or, respectively, tm' if the registers can be triggered by a positive edge). An unambiguous determination of the phase of the input test signal relative to the phase of the clock reference signal therefore results.

The decision as to which comparison signals are allocated to the first group and which ones are allocated to the second group depends on the transit time delays of the system used. If it is assumed that stages 16, 17, 18 each cause a delay of one unit of time, then comparison signals Vs occur at a time tx+3, ty+3, tz+3, respectively. For uncertainties to be avoided, those comparison signals Vs which are sampled with the edge at time tm should not occur at this time. This means that they must occur before or after time tm. This applies in an analog manner to those comparison signals Vs which are sampled with the edge at time tn.

The phase representative value appearing at the output of register 22 is synchronous with the reference signal, i.e., the system clock. This phase value is available at the outputs of latches 14, but in "coded" form. At this point the phase value is not synchronous with the reference signal. Typically, half the outputs are a logic "1" value, and half are a logic "0" value. Elements 17 and 18 decode this coded phase value so that only one output of gates 18 exhibits a logic "1" value. That is, in this example the positive transition of the signals stored in latches 14 is detected, and only one of the plurality of output signals of network 17, 18 changes state when the input signal exhibits a state (amplitude) transition. At this point, at the output of logic network 17, 18, the phase value is synchronous with the input signal, not with the reference signal. Units 19 and 20 are similar and convey respective first and second groups of comparison signals to respective inputs of unit 22 with a defined (clock) delay The phase value is synchronous with the reference signal at the outputs of registers 19 and 20. However, the outputs of registers 19 and 20 change with positive and negative edge transitions of the system clock, respectively. At the output of register 22, the phase representative value will coincide with the positive edge of the system clock reference signal for all possible phases.

Variations of the illustrated embodiment may be provided, as follows. Instead of providing each of the comparison signals via its own comparison line, several or all comparison signals Vs may be provided via a common line, for example, using time-division and/or frequency multiplexing procedures. Separation into two groups may be made, for example, by using a switch controlled by the comparison signals, or temporally.

The outputs of registers 19, 20 may also be used for the reset function without register 22 via OR gate 23.

Different types of registers 19, 20 may be used so that, for example, register 19 samples comparison signals Vs at the rising edge of clock signal Rs, and register 20 does so at a falling edge of signal Rs. In this case inverter 21 can be omitted.

Signal Rs need not be generated by oscillator 10. Instead, Rs may be generated by any other stage, or may be derived from the system clock pulse which may also synchronize oscillator 10.

The principles of the invention may be used in the processing of television signals.

What is claimed is:

1. In a clocked signal processing system including means for comparing an input signal with respect to a reference signal, apparatus providing an unambiguous determination of a phase of said input signal relative to said reference signal, comprising comparison means responsive to said input signal and to said reference signal for providing plural output comparison signals representative of a phase relationship between said input signal and said reference signal, said comparison means including first means for altering a state of one of said plural comparison signals as a function of a significant change in the state of said input signal;

a downstream stage having signal inputs, signal outputs, and a clock input responsive to said reference signal:

second means for conveying a first group of said comparison signals to respective inputs of said downstream stage synchronous with said reference signal as a function of a first clock with a first phase derived from said reference signal; and third means for conveying a second group of said comparison signals to respective inputs of said downstream stage synchronous with said reference signal as a function of a second clock with a second phase different from said first phase and also derived from said reference signal; wherein output signals from said downstream stage provide an unambiguous indication of a phase of said input signal relative to said reference signal.

2. Apparatus according to claim 1 wherein
each of said comparison signals is conveyed via a separate comparison line;
a first group of said comparison lines is coupled to said second means; and
a second group of said comparison lines is coupled to said third means.

3. Apparatus according to claim 1 wherein
said second means comprises a first register;
said third means comprises a second register; and
said said first and second phases of said first and second clocks are mutually inverted.

4. In a clocked signal processing system including means for comparing an input signal with a reference signal, apparatus providing an unambiguous determination of a phase of said input signal relative to said reference signal, comprising a comparator circuit responsive to said input signal and to said reference signal for providing plural output comparison signals representative of a phase relationship between said input signal and said reference signal, said comparator circuit comprising a plurality of latches with a plurality of signal inputs respectively responsive to differently phased versions of said reference signal, a clock input responsive to said input signal, and a plurality of outputs at which said comparison signals respectively appear;

a logic circuit included in said comparator circuit for altering a state of one of said plural comparison signals as a function of a significant change in the state of said input signal;

a downstream stage including a latching network having signal inputs, signal outputs, and a clock input responsive to said reference signal;

first means including a latching network for conveying a first group of comparison signals from said comparison circuit to respective inputs of said downstream stage synchronous with said reference signal as a function of a first clock with a first phase derived from said reference signal; and second means including a latching network for conveying a second group of comparison signals from said comparison circuit to respective inputs of said downstream stage synchronous with said reference signal as a function of a second clock with a second phase different from said first phase and also derived from said reference signal; wherein output signals from said downstream stage provide an unambiguous determination of a phase of said input signal relative to said reference signal.

* * * * *